(12) United States Patent
Lee et al.

(10) Patent No.: US 9,299,563 B2
(45) Date of Patent: Mar. 29, 2016

(54) METHOD FOR FORMING A STRAINED SEMICONDUCTOR STRUCTURE

(71) Applicants: IMEC VZW, Leuven (BE); Samsung Electronics Co. Ltd., Gyeonggi-do (KR)

(72) Inventors: Seung Hun Lee, Seoul (KR); Liesbeth Witters, Linden (BE); Roger Loo, Leuven (BE)

(73) Assignees: IMEC VZW, Leuven (BE); Samsung Electronics Co. Ltd., Suwon-si (KR)

( * ) Notice: Subject to any disclaimer, the term of this patent is extended or adjusted under 35 U.S.C. 154(b) by 0 days.

(21) Appl. No.: 14/313,928

(22) Filed: Jun. 24, 2014

(65) Prior Publication Data

US 2014/0377936 A1   Dec. 25, 2014

(30) Foreign Application Priority Data

Jun. 24, 2013 (EP) .................................... 13173380

(51) Int. Cl.
*H01L 21/02* (2006.01)
*H01L 21/762* (2006.01)
*H01L 29/10* (2006.01)
*H01L 21/3065* (2006.01)

(52) U.S. Cl.
CPC .... *H01L 21/02658* (2013.01); *H01L 21/02587* (2013.01); *H01L 21/76224* (2013.01); *H01L 29/1054* (2013.01); *H01L 21/3065* (2013.01)

(58) Field of Classification Search
None
See application file for complete search history.

(56) References Cited

U.S. PATENT DOCUMENTS

| 2009/0142892 A1 | 6/2009 | Lee et al. |
| 2010/0006907 A1 | 1/2010 | Itokawa |
| 2014/0151766 A1* | 6/2014 | Eneman et al. ............... 257/288 |

FOREIGN PATENT DOCUMENTS

EP    1 439 570 A1    7/2004

OTHER PUBLICATIONS

European Search Report, European Patent Application No. 13173380.0. dated Nov. 5, 2013.

* cited by examiner

*Primary Examiner* — Robert Carpenter
(74) *Attorney, Agent, or Firm* — McDonnell Boehnen Hulbert & Berghoff LLP

(57) ABSTRACT

The present disclosure relates to a method for forming a strained semiconductor structure. The method comprises providing a strain relaxed buffer layer, forming a sacrificial layer on the strain relaxed buffer layer, forming a shallow trench isolation structure through the sacrificial layer, removing at least a portion of an oxide layer on the sacrificial layer, etching through the sacrificial layer such that a portion of the strain relaxed buffer layer is exposed, forming the strained semiconductor structure on the exposed portion of the strain relaxed buffer layer.

18 Claims, 3 Drawing Sheets

METHOD FOR FORMING A STRAINED SEMICONDUCTOR STRUCTURE

CROSS-REFERENCE TO RELATED APPLICATION

This application claims priority to European Patent Application No. 13173380.0 filed on Jun. 24, 2013, the contents of which are hereby incorporated by reference.

FIELD OF THE DISCLOSURE

The present disclosure relates to a method for forming a strained semiconductor structure, the structure being stained in order to improve the performance of the structure.

BACKGROUND OF THE DISCLOSURE

There is a continuous demand for improved integrated circuits having higher performance and lower power consumption. Traditionally, the development of integrated circuits has to a large extent been relying on continuous downscaling of semiconductor structures, such as complementary metal oxide semiconductor (CMOS) devices. To push technology to even smaller dimensions, new device technologies, such as Fin Field Effect Transistor (FinFET) structures, have been introduced in the CMOS mainstream starting from the 14 nm node and below. The FinFET technology relies on a multi-gate transistor structure that offers performance improvements compared to existing planar CMOS devices. In a FinFET, the gate of the device is generally wrapped over the conducting source-drain channel. As a result, lower threshold voltages and better performance may be obtained and reductions in both leakage and dynamic power may also be achieved.

It may also be beneficial to replace the conventional Si-based source-drain channel with high mobility materials, such as Ge. Improved Ge-based pMOS channel performance has, for instance, been demonstrated with an intrinsic hole mobility being significantly larger than for Si and with an increase in device current. However, devices based on relaxed Ge may not out-perform the current state-of-the-art devices comprising strained Si. It is known to those skilled in the art that strain (e.g. uniaxial or biaxial) may be used to improve carrier mobility in microelectronics. This is of technical relevance, as an increase in channel mobility may result in advantages such as reduced electrical resistance, improved efficiency, increased current, and increased speed. Much attention is therefore directed towards developing strained Ge based devices.

Significant advances have been demonstrated in high mobility non-planar devices utilizing SiGe or Ge structures, but integration challenges still remain. It has for instance been identified that contamination and surface roughness at the interfaces within the devices are limiting the device performance. Hence, there is a need for improving surface quality in order to, for instance, reduce problems such as dislocation formation and surface roughness of the strained channel material. Consequently, there is a desire for better methods for forming nanoscale devices comprising strained semiconductor structures.

SUMMARY OF THE DISCLOSURE

Various aspects of the present disclosure help to alleviate the above mentioned drawbacks and problems.

In particular according to an aspect of the present disclosure, a method for forming a strained semiconductor structure is provided. The method includes providing a strain relaxed buffer layer, forming a sacrificial layer on the strain relaxed buffer layer, forming a shallow trench isolation structure through the sacrificial layer, removing at least a portion of an oxide layer on the sacrificial layer, etching through the sacrificial layer such that a portion of the strain relaxed buffer layer is exposed, and forming the strained semiconductor structure on the exposed portion of the strain relaxed buffer layer.

The disclosure may be based, at least in part, on the realization that prior art methods for fabricating stained semiconductor structures involves challenging processes for removal of oxides from a strain relaxed buffer (SRB) layer comprising, for instance, SiGe or SiC. Removal of oxide from the SRB layer is generally important for efficient and high-yield fabrication of the strained semiconductor structures. The presence of oxides on the SRB layers may lead to variations in the recess being formed. Further, oxide residues on the SRB layer may lead to surface roughness and defects in the strained semiconductor structures being formed on the SRB layer, which in turn may lead to reduced device performance. Oxide removal from surfaces such as SiGe is, moreover, known to be challenging and commonly involves complicated pre-cleaning and high-temperature baking steps. Consequences of the elevated temperatures, typically around 700-800° C., during baking is that roughening of the SiGe surface, Ge-migration, and/or Ge coalescence may occur, which may in turn reduce device performance.

By using a sacrificial layer on the top of the SRB layer, oxide formation and atom migration on the SRB layer may be counteracted when forming the strained semiconductor structure. This is a novel concept and counteracts many of the problems mentioned above. The method therefore provides well-controlled trench recess formation and improved regrowth of the strained semiconductor structure. High temperature baking steps may moreover be omitted.

Generally, shallow trench isolation (STI) may be understood as a standard technique to form electrically isolated regions, often referred to as active regions, in conventional semiconductor devices. In STI shallow trenches are etched in the semiconductor material or materials and a thin oxide liner is thermally grown on the trench walls. The trench is then refilled with a thick insulating material. The resulting structure is referred to as a STI structure.

In the context of the present disclosure, the term sacrificial layer may be understood as a semiconductor layer that is formed on top of the SRB layer in order to counteract oxidation of a surface of the SRB being in contact with the sacrificial layer. The sacrificial layer may later be removed and thus sacrificed, such that at least part of the SRB layer is exposed.

The wording strained semiconductor structure in the context of the present disclosure may be construed as a structure that is under compressive or tensile strain. The strained semiconductor structure may further refer to any strained semiconductor structure suitable for integration in semiconductor devices, such as multi-gate transistors, utilizing strained regions.

According to an embodiment of the present disclosure, the sacrificial layer may comprise Ge or Si. An advantage being that the oxide removal from the sacrificial layer is improved as removal of oxide from Ge or Si can be more efficiently performed than from SiGe.

According to an embodiment of the present disclosure, the sacrificial layer may consist of Ge or Si.

The sacrificial layer may have a thickness of 2-50 nm, preferably 20-40 nm or 5-20 nm. An advantage of using a sacrificial layer having a thickness of 20-40 nm is that the strong etch selectivity between the sacrificial layer and the SRB layer allows for an etching which substantially only etches the sacrificial layer. It is hence possible to use the thickness of the sacrificial layer to tailor the depth of the STI structure and the thickness of the strained semiconductor structure. In the following description, a sacrificial layer having a thickness of 20-40 nm is referred to as a thick sacrificial layer.

Using a sacrificial layer having a thickness of 5-20 nm has the advantage that if defects or dislocations are present at the interface between the sacrificial layer and the SRB layer, these defects may be removed as the etching may involve also removing a portion of the SRB layer, e.g., a portion beyond the initial interface. The wording thin may therefore be construed as a thickness small enough such that also a portion of the SRB layer may be etched. In the following, a sacrificial layer having a thickness of 5-20 nm is referred to as a thin sacrificial layer.

As a result a SRB layer surface may be provided that is suitable as a starting surface for regrowth. As discussed above, it should be noted that the etching may further comprise etching a portion of the strain relaxed buffer or SRB layer.

According to another embodiment, the etching may be performed using gas comprising HCl. HCl is known to have large etch selectivity between Ge and Si. Generally, Ge may be etched at higher speed than Si allowing for improved recess control when etching the sacrificial layer and/or the SRB layer.

According to an embodiment of the present disclosure, the strained semiconductor structure may comprise Ge or Si. This is advantageous as the mobility in strained Ge or Si is improved as compared to their relaxed crystal structures. Moreover, the strain in the Ge or Si layer may be tuned, for instance, by changing the Ge content in a SiGe SRB layer being adjacent to the strained semiconductor structure.

According to an embodiment of the present disclosure, the processes of removing at least a portion of an oxide layer on the sacrificial layer, etching through the sacrificial layer such that a portion of the strain relaxed buffer layer is exposed, and forming the strained semiconductor structure on the exposed portion of the strain relaxed buffer layer may be performed in-situ in an epitaxial growth chamber system.

By performing the above given steps in an epitaxial growth chamber system, commonly referred to as in-situ, a controlled environment may be provided such that oxidation of the sacrificial layer, the SRB layer, and the strained semiconductor structure may be counteracted. As a result, a more even recess may be obtained allowing for the formation of an improved strained semiconductor structure.

The wording epitaxial growth chamber system may be understood as any system having an enclosed volume that may be connected to an apparatus for epitaxial growth. Epitaxy is the process of layer-by-layer growth of a material of a particular crystal structure and composition on top of another material. Common types of epitaxial techniques include vapour phase, liquid phase, and solid phase growth in accordance with the source of the atoms being used for the growth. Inside the enclosed volume, a vacuum or a gas atmosphere is produced such that a controlled environment is provided where for instance contamination and oxidation may be counteracted. The growth chamber of the apparatus for epitaxial growth is preferably a single- or multi-chamber system that may allow for efficient formation of an improved strained semiconductor structure.

According to an embodiment of the present disclosure, the strained semiconductor structure may be formed by epitaxial growth. This is advantageous as epitaxial growth allows for fabrication of semiconductor materials having superior material quality as the material structure and composition may be controlled at the atomic level.

According to an embodiment of the present disclosure, the process of removing may be performed using gas comprising HF and/or HBr. HF and HBr may be used to remove oxide from, for example, Si and Ge surfaces. Additionally, a termination layer may be formed on top of the surfaces, which helps to counteract reoxidation.

The method may further comprise doping of the sacrificial layer. This provides additional measures to tailor the etch selectivity, which helps to improve recess control, as increased doping of Ge or Si results in faster etching of the respective materials.

According to an embodiment of the present disclosure, the oxide layer may be a native oxide layer.

The method may further comprise providing the strain relaxed buffer layer on a substrate. This is advantageous as the stability of the strain relaxed buffer layer may be improved. This also can facilitate handling of the strain relaxed buffer layer.

According to another embodiment, the strain relaxed buffer layer may comprise a SiGe material. This is advantageous as the SRB layer thereby provides a suitable base layer upon which Ge or Si can be grown with high material quality. It should be noted that Si has a smaller lattice constant than SiGe resulting in tensile strained Si, whereas Ge has a larger lattice constant than SiGe resulting in compressively strained Ge. It is thereby possible to achieve both p-FET and n-FET operation.

According to one embodiment, the SiGe material may have a Ge content in the range 40-90%, preferably 50-75%. The preferred range of 50-75% of Ge is advantageous as it may provide sufficient strain in the strained semiconductor structure and further counteracts dislocation formation in the strained semiconductor structure, e.g., allows for an increased critical thickness of the strained semiconductor structure.

According to another embodiment of the present disclosure, the strain relaxed buffer layer may comprise a SiC material. It is advantageous to use SiC as it has a smaller lattice spacing or constant than Si. The use of SiC may therefore result in a compressive strain in a strained semiconductor structure of Si, which is also suitable for FET operation. Hence, the option to use SiGe or SiC in the strain relaxed buffer layer may improve flexibility when designing integrated circuits based on strained semiconductor structures.

According to one embodiment of the present disclosure, the SiC material may have a C content in the range 0.01-10%, preferably 0.1-5%. The preferred range of 0.1-5% of C is advantageous as it provides sufficient strain in the strained semiconductor structure and further counteracts dislocation formation in the strained semiconductor structure.

BRIEF DESCRIPTION OF THE DRAWINGS

These and other aspects of the present disclosure will now be described in more detail, with reference to the appended drawings showing embodiments of the disclosure.

As illustrated in the figures, the sizes of layers and regions are exaggerated for illustrative purposes and, thus, are provided to illustrate the general structures of embodiments of the present disclosure. Like reference numerals refer to like elements throughout.

DETAILED DESCRIPTION

Figure 1:
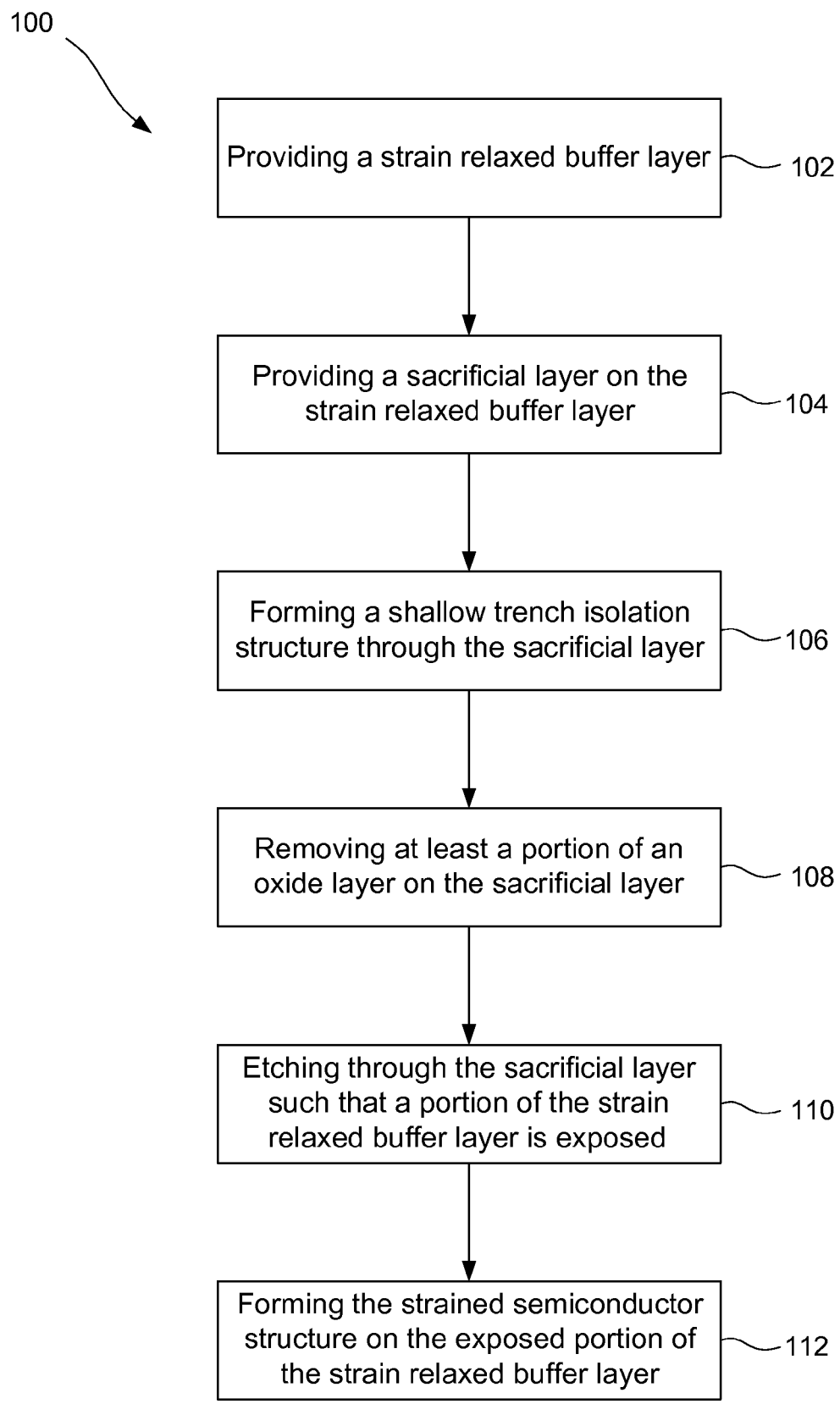
FIG. 1 is a flow chart of a method for forming a strained semiconductor structure according to an embodiment of the disclosure.

FIG. 1 illustrates a method 100 for forming a strained semiconductor structure. The method 100 comprises providing a strain relaxed buffer layer 102, providing a sacrificial layer on the strain relaxed buffer layer 104, forming a shallow trench isolation structure through the sacrificial layer 106, removing at least a portion of an oxide layer on the sacrificial layer 108, etching through the sacrificial layer such that a portion of the strain relaxed buffer layer is exposed 110, and forming the strained semiconductor structure on the exposed portion of the strain relaxed buffer layer 112.

The method 100 is based, at least in part, on the realization that by using a sacrificial layer on the top of the strain relaxed buffer layer (SRB layer) oxide formation and atom migration on the SRB layer may in relation to prior art be counteracted when forming the strained semiconductor structure. The method may therefore provide well-controlled trench recess and improved regrowth of the strained semiconductor structure.

In the following, the method 100 will be further described and detailed with reference to FIGS. 2 and 3. The below description provides details of how the method 100 is used to fabricate strained semiconductor structures 212, 312 according to embodiments of the method 100.

It is to be appreciated that those skilled in the art may change or modify the order in which the method 100 for forming a strained semiconductor structure 212, 312 is executed without departing from the scope and spirit of the present disclosure. It should therefore be understood that the method may further comprise additional processes and/or steps which are known to those skilled in the art.

Figure 2:
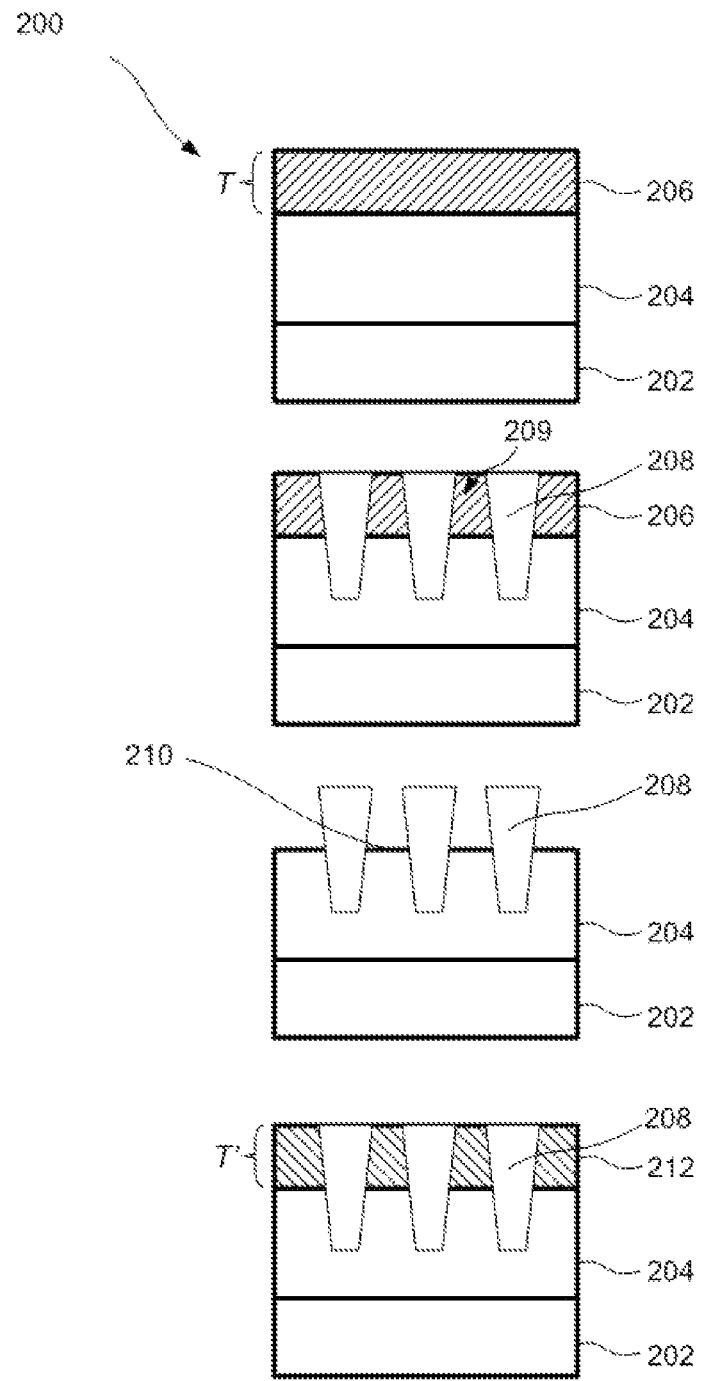
FIG. 2 illustrates the formation of a strained semiconductor structure according to an embodiment of the present disclosure.

FIG. 2 illustrates the formation 200 of a strained semiconductor structure 212 according to a currently preferred embodiment of the present disclosure. A SRB layer 204 is provided by epitaxial growth on a semiconductor substrate 202. The substrate 202 provides stability for the SRB layer 204 and easy handling. The SRB layer 204 may be formed from SiGe and the substrate 202 may be an un-patterned Si substrate, often referred to as a blanket substrate. The Ge content of the SiGe is, according to this example, increased during the epitaxial growth such that dislocations and stress in the material caused by the lattice mismatch between Ge and Si is counteracted. The thickness of the SiGe film may be, for example, from about 1 micrometer to 10 micrometers. A thinner SRB layer 204 may lead to higher threading dislocation density (TDD) as the SRB layer 204 cannot effectively release strain in the SiGe, which may result in defects and less strain in the strained semiconductor structure. A thicker SRB layer 204 could lead to problems associated with wafer bending. In general, care should be taken to avoid dislocations while not unduly limiting a thickness of the SiGe. A Ge content of 50-75% is accordingly preferably reached at the uppermost part of the SRB layer 204. This is advantageous as strained Ge of a higher quality may be grown on top of SiGe having this material composition. A higher quality of the strained Ge may lead to a strained semiconductor structure 212 having lower surface roughness, lower defect density, and/or higher strain. In other words, the dislocation density in the Ge may be reduced. A preferably 20-40 nm thick sacrificial layer 206 of Ge is fabricated on top of the SRB layer 204. In one example, the fabrication comprises epitaxial growth within the same epitaxial growth chamber system used for fabricating the SRB layer 204. This generally helps to counteract contamination during fabrication and facilitates efficient epitaxial growth.

It may be advantageous, as will be discussed, to use Ge for the sacrificial layer 206 as oxide removal from Ge surfaces is more effective as compared to SiGe surfaces. It is thereby possible, via the thickness (T') of the sacrificial layer 206, to tailor the depth of the STI structure and the thickness (T') of the strained semiconductor structure 212. In the above example, T is substantially equal to T'. A suitable thickness range for the strained semiconductor 212 structure may be 20-40 nm, with a preferred thickness range of 30-40 nm.

By forming a STI structure 208 through the sacrificial layer 206 and partly through the SRB layer 204, electrically isolated regions 209 may be formed as the trenches are filled with an insulating material, such as silicon dioxide.

Oxide (not shown) on the sacrificial layer 206 is then removed from the sacrificial layer 206 using gas comprising HF and/or HBr, for example. The person skilled in the art would realize that other techniques such as reactive-ion etching (RIE), plasma cleaning, and/or dry etching may be used for removing the oxide.

Etching, using gas comprising HCl, is then performed through the sacrificial layer 206 such that at least a portion 210 of the SRB layer 204 is exposed. An advantage of using a thick (20-40 nm) sacrificial layer 206 of Ge is that the high etch selectivity of HCl allows for substantial etching of the sacrificial layer 206 only. In practice, Ge is etched about 10 times faster than Si. Moreover, a well-controlled trench recess may be provided that allows for improved regrowth of the strained semiconductor structure 212, which is finally fabricated on the exposed portion 210 of the SRB layer 204. In one example, the fabrication of the strained semiconductor structure 212 is done by epitaxial growth. As discussed above, the fabrication may be performed within the same epitaxial growth chamber system. It is, however, realized that the fabrication may be performed in a plurality of separated systems, between which the substrate 202 may be transferred in ambient conditions or using transfer systems utilizing a controlled environment such as vacuum or gas environment.

As discussed above, the strain level in the strained Ge structure may be altered by adjusting the Ge content in the SiGe material. The strain increases the mobility of the carriers in the Ge material leading to improved device performance.

The processes of removing 108 at least a portion of an oxide layer on the sacrificial layer 206, etching 110 through the sacrificial layer 206 such that a portion 210 of the SRB layer 204 is exposed, and/or forming 112 the strained semiconductor structure 212 on the exposed portion 210 of the SRB layer 204 may be performed in an epitaxial growth chamber system. By performing the above processes in a controlled environment inside the epitaxial growth chamber system, oxidation of the sacrificial layer 206, the SRB layer 204, and the strained semiconductor structure 212 may be counteracted. As a result, an improved recess in terms of smoothness may be obtained.

Alternatively, the SRB layer 204 may instead be made of SiC and the thick (20-40 nm) sacrificial layer may be of Si or Ge. The strained semiconductor structure 212 may, according to this embodiment, be made of Si. SiC has a smaller lattice spacing or constant than Si and, as a result, the strained semiconductor structure 212 is under compressive strain. Such structures are, as discussed above, suitable for FET operation.

The SiC material has a C content in the range 0.01-10%, preferably 0.1-5%. The preferred range of 0.1-5% of C may be advantageous as it provides sufficient strain in the strained semiconductor structure 212 and may further counteract dislocation formation in the strained semiconductor structure 212.

Figure 3:
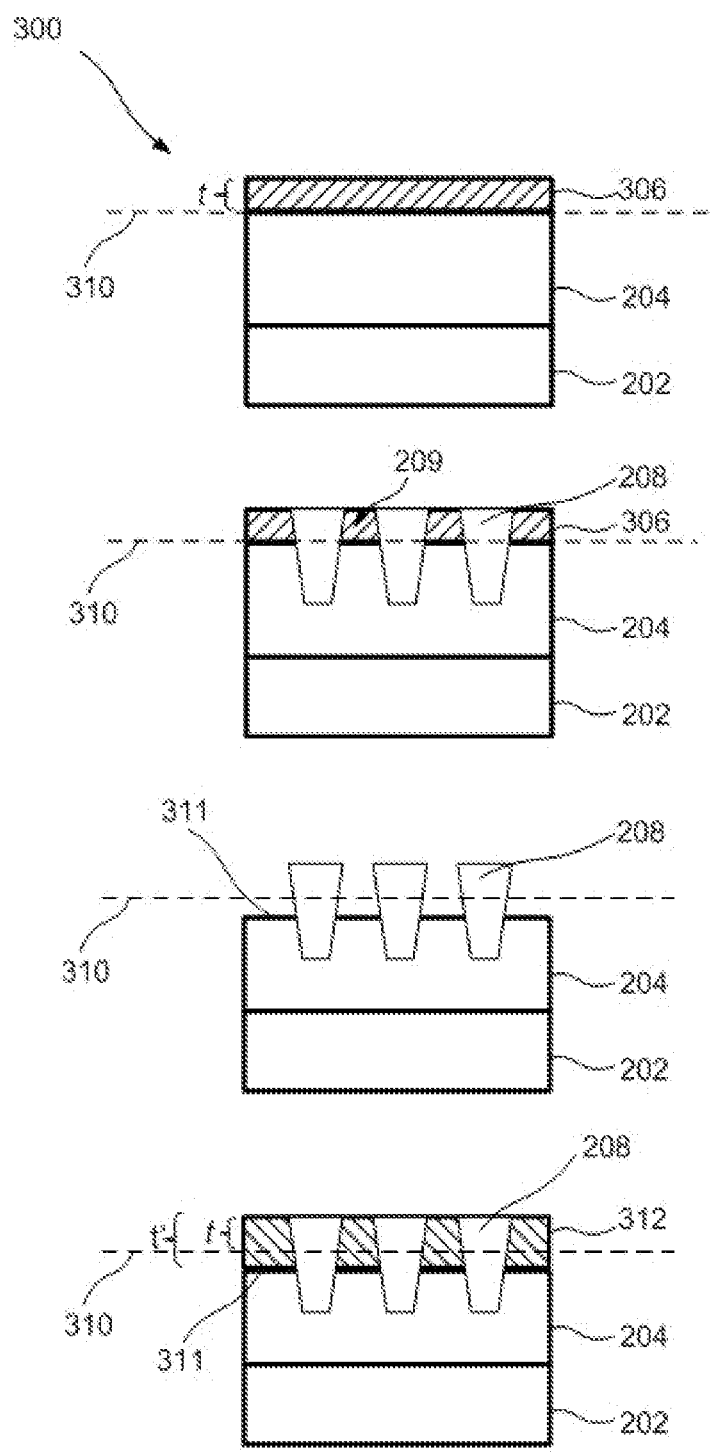
FIG. 3 illustrates the formation of a strained semiconductor structure according to another embodiment of the present disclosure.

FIG. 3 illustrates the formation 300 of a strained semiconductor structure 312 according to another embodiment of the present disclosure. A SRB layer 204 is provided by epitaxial growth on a semiconductor substrate 202. The substrate 202 provides stability for the SRB layer 204 and facilitates easy handling. Here the SRB layer 204 is of SiGe and the substrate 202 is of blanket Si. The Ge content of the SiGe is according to this example increased during the epitaxial growth such that dislocations and stress in the material caused by the lattice mismatch between Ge and Si is counteracted. A Ge content of 50-75% is preferably reached at the uppermost part of the SRB layer 204. High quality Ge may be grown on top of SiGe having this material composition, for instance, the dislocation density in the Ge may be reduced.

A preferably 5-20 nm thin sacrificial layer 306 of Ge is fabricated, preferably by epitaxial growth, on top of the SRB layer 204. As previously discussed, it may be advantageous to use a Ge sacrificial layer 306 as oxide removal from Ge surfaces is more effective as compared to SiGe surfaces. A thin (5-20 nm) sacrificial layer 306 having a thickness (t) has the advantage that if, for instance, defects or dislocations are present at the interface 310 between sacrificial layer 306 and the SRB layer 204, these will be removed during the etching. This is achieved as the etching also involves removing a portion of the SRB layer 204, such as by etching beyond the initial interface 310. As a result, a fresh surface 311 of the SRB layer 204 is provided that is suitable as a starting surface for regrowth. The regrown strained semiconductor structure 312 of Ge has a thickness (t'), which according to this embodiment is larger than the thickness t of the sacrificial layer 306. It is, however, to be understood that any suitable thicknesses may be used below the critical thickness of the material used for forming the strained semiconductor structure 312. The potential advantages of the above embodiment are however similar to the ones described in relation to the embodiment of FIG. 2 and will not be discussed further.

According to another embodiment, a thin (5-20 nm) sacrificial layer 306 of Si may be used. An advantage of using Si is that oxide removal from the Si surface is improved as compared to removing oxide from a SiGe surface. Moreover the etching rates are different for Si and SiGe, which allows for improved processing of the strained semiconductor structures 312. An additional advantage is that there is only limited Si migration on the Si surface, even at elevated temperatures such as during a high-temperature baking, which helps to improve the surface smoothness of the sacrificial layer 306 leading to improved formation of the strained semiconductor structure 312.

According to yet another embodiment of the present disclosure, the SRB layer 204 may be made of SiC and the thin (5-20 nm) sacrificial layer 306 of Si or Ge. The strained semiconductor structure 312 is according to this embodiment made of Si. The SiC material has a C content in the range 0.01-10%, preferably 0.1-5%. The advantages of the above embodiment are however similar to the ones described in relation to using thin sacrificial layers and a SiC material and will not be discussed further.

The person skilled in the art will realize that the present disclosure by no means is limited to the embodiments described above. On the contrary, many modifications and variations are possible within the scope of the appended claims.

For example, the method 100 may further comprise doping of the sacrificial layer. This provides additional measures to tailor the etch selectivity, leading to improved recess control, as increased doping of Ge or Si results in altered etch rates for the respective materials. Examples of strain inducing elements according to an embodiment may include phosphorus, boron, nitrogen, or tin. The doping may be performed during the growth process in an epitaxial growth chamber system using a dopant source or by ion implantation.

In another example, a SiC layer may also be provided on the substrate 202 like Si according to the disclosure above for a SiGe SRB layer. The substrate 202 is preferable un-patterned Si, which simplifies device fabrication, but could also be patterned as is understood by a person skilled in the art.

In an example embodiment, the strained semiconductor structure 212, 312 may comprise SiGe or Ge where the strain is induced by increasing the Ge content. The Ge content of the strained semiconductor structure 212, 312 may be higher than the Ge content of a SiGe buffer layer 204, and preferably substantially pure Ge.

According to an embodiment of the present disclosure the Ge content of the strained semiconductor structure 212, 312 may be constant throughout its whole volume. Optionally, the Ge content of the strained semiconductor structure 212, 312 may be increased from a lower value at the base, adjacent to the SRB layer 204, to the top of the structure 212, 312.

In an embodiment, the strained semiconductor structure 212, 312 comprises SiC where the strain is induced by increasing the C content. The C content of the strained semiconductor structure 212, 312 may be higher than the C content of SiC buffer and may preferably be between 0.1-2% C.

Additionally, variations to the disclosed embodiments can be understood and effected by the skilled person in practicing the claimed disclosure, from a study of the drawings, the disclosure, and the appended claims. In the claims, the word comprising does not exclude other elements or steps, and the indefinite article a or an does not exclude a plurality. The mere fact that certain measures are recited in mutually different dependent claims does not indicate that a combination of these measured cannot be used to advantage.

The invention claimed is:

1. A method for forming a strained semiconductor structure comprising: providing a strain relaxed buffer layer; forming a sacrificial layer on the strain relaxed buffer layer, wherein the sacrificial layer is a separate layer formed on the strain relaxed buffer layer; after forming the sacrificial layer, forming a shallow trench isolation structure through the sacrificial layer; removing at least a portion of an oxide layer on the sacrificial layer; etching through the sacrificial layer such that a portion of the strain relaxed buffer layer is exposed; and growing the strained semiconductor structure on the exposed portion of the strain relaxed buffer layer.

2. The method according to claim 1, wherein the sacrificial layer comprises Ge or Si, and wherein the strained semiconductor structure comprises Ge or Si.

3. The method according to claim 1, wherein the sacrificial layer has a thickness of 2 to 50 nm.

4. The method according to claim 3, wherein the sacrificial layer has a thickness of 20 to 40 nm.

5. The method according to claim 3, wherein the sacrificial layer has a thickness of 5 to 20 nm.

6. The method according to claim 1, wherein the etching further comprises etching a portion of the strain relaxed buffer layer.

7. The method according to claim 1, wherein the etching is performed using gas comprising HCl, and wherein the removing is performed using gas comprising at least one of HF or HBr.

8. The method according to claim 1, wherein removing at least a portion of an oxide layer on the sacrificial layer, etching through the sacrificial layer such that a portion of the strain relaxed buffer layer is exposed, and growing the strained semiconductor structure on the exposed portion of the strain relaxed buffer layer are performed in-situ in an epitaxial growth chamber system.

9. The method according to claim 1, further comprising doping the sacrificial layer.

10. The method according to claim 1, wherein the oxide layer is a native oxide layer.

11. The method according to claim 1, further comprising providing the strain relaxed buffer layer on a substrate.

12. The method according to claim 1, wherein the strain relaxed buffer layer comprises a SiGe material.

13. The method according to claim 12, wherein the SiGe material has a Ge content in the range of 40 to 90%.

14. The method according to claim 13, wherein the SiGe material has a Ge content in the range of 50 to 75%.

15. The method according to claim 1, wherein the strain relaxed buffer layer comprises a SiC material.

16. The method according to claim 15, wherein the SiC material has a C content in the range of 0.01 to 10%.

17. The method according to claim 16, wherein the SiC material has a C content in the range of 0.1 to 5%.

18. The method according to claim 1, wherein the strain relaxed buffer layer comprises a SiGe material or a SiC material, and the sacrificial layer consists of Ge or Si.

* * * * *